United States Patent [19]

Crackel et al.

[11] 4,354,277

[45] Oct. 12, 1982

[54] SIGNAL ACQUISITION SYSTEM

[75] Inventors: John E. Crackel, Carson; William J. Stieritz, Torrance, both of Calif.

[73] Assignee: TRW Inc., Redondo Beach, Calif.

[21] Appl. No.: 97,088

[22] Filed: Nov. 23, 1979

[51] Int. Cl.³ .......................... H04B 1/26; H03L 7/00; H03D 3/02

[52] U.S. Cl. .................................... 455/259; 329/122; 331/25; 331/34; 455/208

[58] Field of Search ................................ 455/257–260, 455/263–265, 208–211, 164, 182, 192; 331/1 A, 17, 18, 25, 32, 34; 328/133, 134; 307/232, 511; 329/122

[56] References Cited

U.S. PATENT DOCUMENTS

| | | | |
|---|---|---|---|
| 2,771,546 | 11/1956 | Schock | 455/259 |
| 3,346,814 | 10/1967 | Haggai | 455/260 |
| 3,678,394 | 7/1972 | Ebisch | 455/259 |
| 3,746,998 | 7/1973 | Fletcher et al. | 455/260 |
| 3,805,153 | 4/1974 | Gallant | 328/133 |
| 3,810,036 | 5/1974 | Bloedorn | 331/15 |
| 3,821,650 | 6/1974 | Kase et al. | 455/192 |
| 3,983,501 | 9/1976 | Lindstrum | 329/122 |
| 4,028,587 | 6/1977 | Holmlund et al. | 315/377 |
| 4,107,624 | 8/1978 | Turner | 329/122 |

Primary Examiner—Marc E. Bookbinder
Attorney, Agent, or Firm—Donald R. Nyhagen; Robert W. Keller

[57] ABSTRACT

A frequency-tracking feedback circuit for acquiring a communication carrier signal from a relatively noisy environment. The circuit includes a digital phase-frequency detector, a limiter, a mixer, and a voltage-controlled oscillator, connected in a long control loop in such a manner that an input band of signals is translated in frequency until the desired carrier is centered within a relatively narrow acquisition window. The characteristics of the loop are such that acquisition may be achieved even when the total power of the noise in the input signal band exceeds the carrier power, provided that the noise is relatively uniformly distributed over the input band. A technique is also disclosed for compensating from any unbalance in the noise spectrum, so that relatively low carrier-to-noise ratios can be tolerated. Also disclosed are improvements for dynamically varying the parameters of the frequency-tracking loop in such a manner as to reduce acquisition time, and a technique for detecting acquisition and handing control to post-acquisition control circuitry.

22 Claims, 10 Drawing Figures

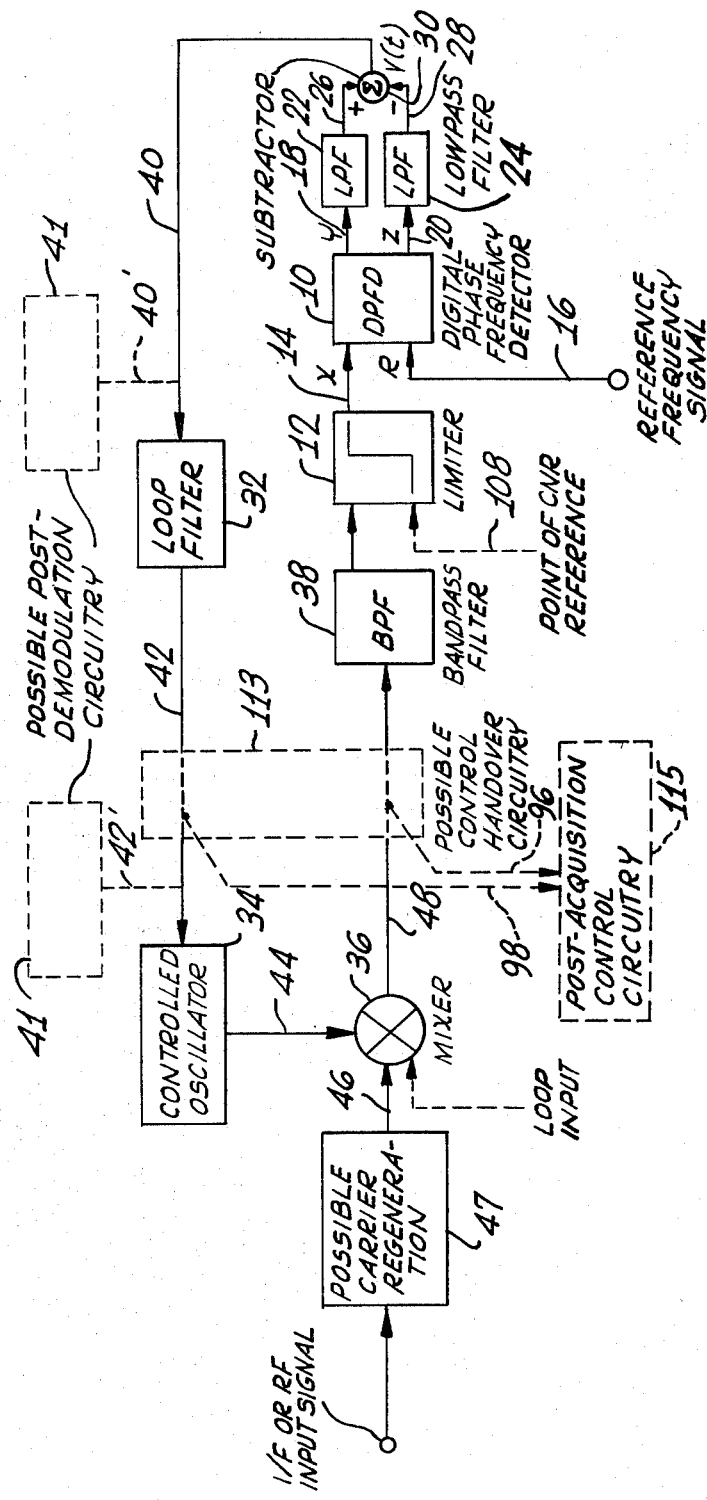

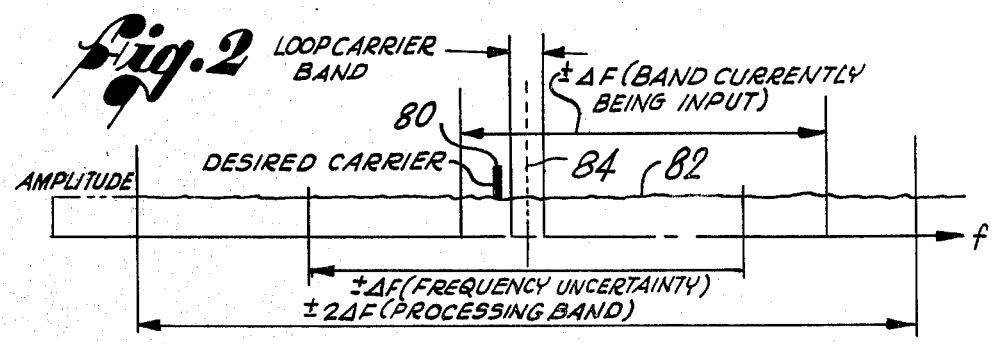
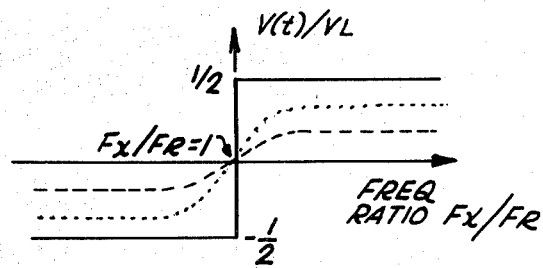
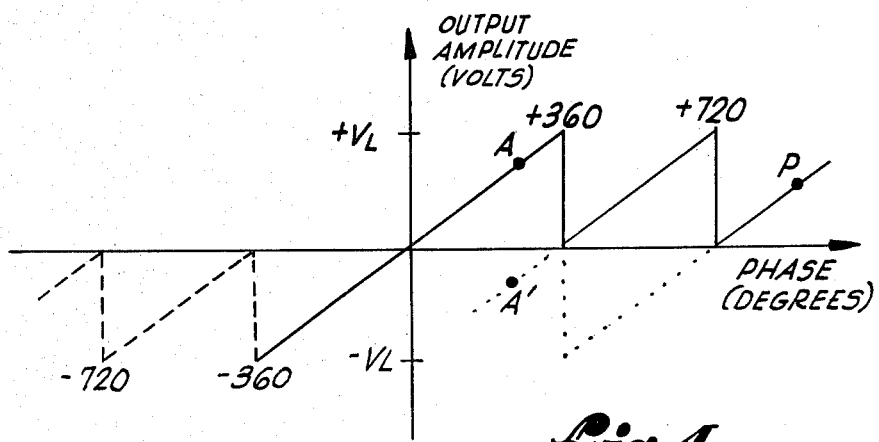

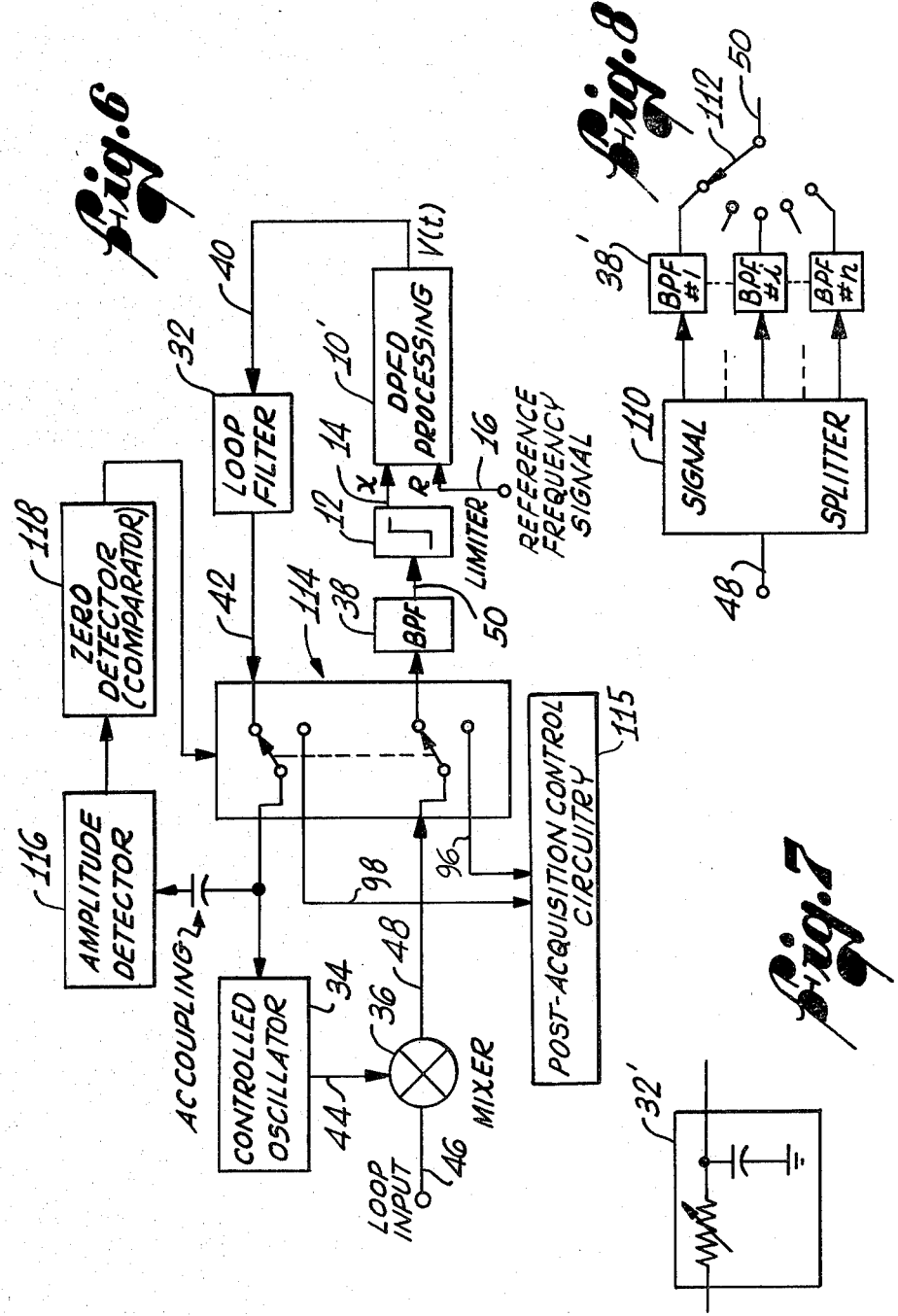

SIGNAL ACQUISITION SYSTEM

The invention described herein was made in the performance of work under NASA Contract No. 525000, and is subject to the provisions of Section 3 of the National Aeronautics and Space Act of 1958 (72 Stat. 435; 42 U.S.C. 24570).

BACKGROUND OF THE INVENTION

This invention relates generally to communication systems in which an information signal is used to modulate a carrier signal, which is subsequently demodulated in a receiver. More particularly, the invention relates to techniques for acquiring such a carrier signal from a relatively noisy background, when the actual frequency of the carrier is not accurately known. The frequency of a transmitted carrier signal can vary from an expected or nominal value for a number of reasons. Crystal oscillators used in transmitters can vary significantly in frequency. In space communications, substantial frequency shifts can be caused by the Doppler effect, depending on the relative velocity between the transmitter and receiver.

Since the frequency of the received carrier signal may not be the frequency expected and may vary with time, it is necessary to provide means for initially acquiring the carrier signal, and generally then staying "locked on" to the carrier so that communications will continue to be received in spite of further frequency variations. Typically, the received signal is mixed or heterodyned with another locally generated signal to produce a signal of intermediate frequency for processing in the receiver. One well known type of signal acquisition technique is known as automatic frequency control (AFC). An AFC circuit typically comprises a frequency discriminator and a local oscillator. The discriminator produces a signal indicative of the error or deviation of the intermediate frequency from a desired value, and the discriminator output is used to control the local oscillator, in order to produce an intermediate frequency signal of the desired frequency, no matter what the variations in frequency of the incoming signal.

Unfortunately, however, the discriminator is highly sensitive to noise, since it functions essentially as an amplitude detector, and noise of all frequencies produces a discriminator response just as the desired carrier signal does. Moreover, as the frequency of the incoming signal becomes centered on the discriminator characteristic, the signal level obtained necessarily decreases relative to a full-scale level, and this decrease is effectively a loss in signal-to-noise ratio.

In general, acquisition of a carrier signal requires that a desired frequency band be automatically tuned so that its center frequency lies within a narrow range, which will be referred to herein as the acquisition window. The center frequency of the desired band may initially lie anywhere within a wider range, which represents the range of maximum frequency uncertainty. Ideally, the acquisition process must satisfy desired acquisition time requirements for a particular application, and must be able to achieve these goals in spite of the presence of noise and interference signals.

It is also highly desirable that the acquisition system should operate in such a manner that there is virtually no possibility that the desired signal will not be centered in the acquisition window. More particularly, there should also be virtually no possibility that the system will lock onto a signal that is not the desired carrier signal. Such false locking may occur, for example, in acquisition systems that utilize frequency sweeping. In such systems, a modulation sideband within the acquisition window may be incorrectly processed as the carrier.

It will be appreciated from the foregoing that there is a clear need for a signal acquisition system that is capable of acquiring a desired carrier signal centered somewhere within a range of frequency uncertainty, even when the carrier signal is obscured by relatively large noise and interference components. As will be explained further below, the present invention satisfies this need.

SUMMARY OF THE INVENTION

The present invention resides in a signal acquisition system utilizing a digital phase-frequency detector in conjunction with a limiter, a controlled oscillator, and a mixer, all connected in a frequency-tracking loop. Basically, an input signal containing the desired carrier signal, together with noise and interference components, is introduced to one input terminal of the mixer, an output of the controlled oscillator is introduced to the other input terminal. The input signal is translated in frequency by the mixer, i.e., each frequency component of the input signal is translated to a new, usually lower, frequency by a frequency difference determined by the output frequency of the controlled oscillator. The translated input signal is then bandpass filtered, and passed through the limiter, which limits both positive and negative swings of the signal to relatively low levels, and thereby provides a digitized version of the signal for application as one input of the digital phase-frequency detector.

As will be explained in more detail, the second input of the digital phase-frequency detector is provided by a reference-frequency signal. The outputs of the phase-frequency detector are combined to yield a signal indicative of the difference in frequency or phase between the reference signal and the translated and limited input signal. After further filtering in a loop filter, the output of the digital phase-frequency detector is applied to control the frequency of the voltage-controlled oscillator. The oscillator output is applied to the mixer, completing the loop.

So long as the noise components are uniformly distributed across the frequency band input to the frequency tracking loop, it operates in such a manner that the input signal is translated in frequency until the translated carrier signal is equal in frequency to the reference frequency signal. Then, the digital phase-frequency detector locks onto the carrier signal and operates thereafter as a phase detector.

The signal acquisition system of the invention is extremely effective in acquiring a carrier signal in relatively noisy environments, i.e., when there are noise components at other frequencies in the spectrum. As will be appreciated from the following more detailed description, the signal acquisition system is most effective in noisy environments in which the noise spectrum is relatively flat, i.e., when the noise components provide substantially equal amplitude contributions at all frequencies over a band in which the carrier signal might be found. Some modulation schemes that spread signal spectrums such as those involving pseudo-random-noise codes tend to produce flat background spectrums after the spreading of the signal spectrum is removed. To this end, a method and means are provided for injecting compensating signals into the digital phase-frequency loop, to simulate a practically flat noise spectrum when the spectrum is not, in fact, as flat as desired.

In accordance with another aspect of the invention, the bandwidth of the bandpass filter in the loop can be made variable, as by including a plurality of bandpass filters having bandwidths varying from a relatively wide one corresponding to the range of frequency uncertainty, to a relatively narrow one, perhaps as narrow as the acquisition window within which the carrier is to be located. As the circuit operates to acquire the carrier signal, the bandwidth of the filter can be reduced, thereby increasing the carrier-to-noise ratio and further accelerating the acquisition process. The filters can be switched either on the basis of a frequency monitoring device, or in a predetermined time delay sequence.

In accordance with another aspect of the invention, the loop bandwidth, as determined by the loop filter characteristics, may be continuously reduced as the acquisition proceeds. The principal purpose of the loop filter is to minimize overshooting and loop jitter as the point of acquisition is reached. A narrow loop bandwidth results in a minimal loop jitter. However, an initially wide loop bandwidth can be effective in reducing the total acquisition time. Accordingly, in accordance with this aspect of the invention, the loop bandwidth is made relatively wide initially, on the assumption that the carrier frequency is at or near the maximum frequency uncertainty range, and is gradually reduced to a small value required to minimize loop jitter when the acquisition window is reached.

In accordance with yet another aspect of the invention, means are provided for detecting when the desired signal has been acquired, so that control may be switched from the frequency-tracking loop of the invention to another control system, such as a conventional phase-locked loop.

It will be appreciated from the foregoing that the present invention represents a significant advance in the field of signal acquisition systems. In particular, it provides for the acquisition of signals in relatively noisy or interference-prone environments, and, unlike some prior art systems, is extremely resistant to false locking problems. Other aspects and advantages of the system will become apparent from the following more detailed description, taken in conjunction with the accompanying drawings.

BRIEF DESCRIPTION OF THE DRAWINGS

FIG. 1 is a block diagram of a signal acquisition system embodying the principles of the present invention;

FIG. 2 is a diagrammatical representation of an input frequency spectrum including a desired carrier signal to be acquired by the system of the invention;

FIG. 3 is a graph showing the frequency characteristic of a digital phase-frequency detector included in the system of FIG. 1;

FIG. 4 is a graph showing a phase characteristic of the same digital phase-frequency detector;

FIG. 6 is a block diagram of the signal acquisition system of the invention, showing improvements involving post-acquisition handover circuitry;

FIG. 7 shows an alternate form of a low-pass loop filter;

FIG. 8 is a block diagram showing the use of a plurality of bandpass filters in the system of the invention;

DESCRIPTION OF THE PREFERRED EMBODIMENT

Figure 5:
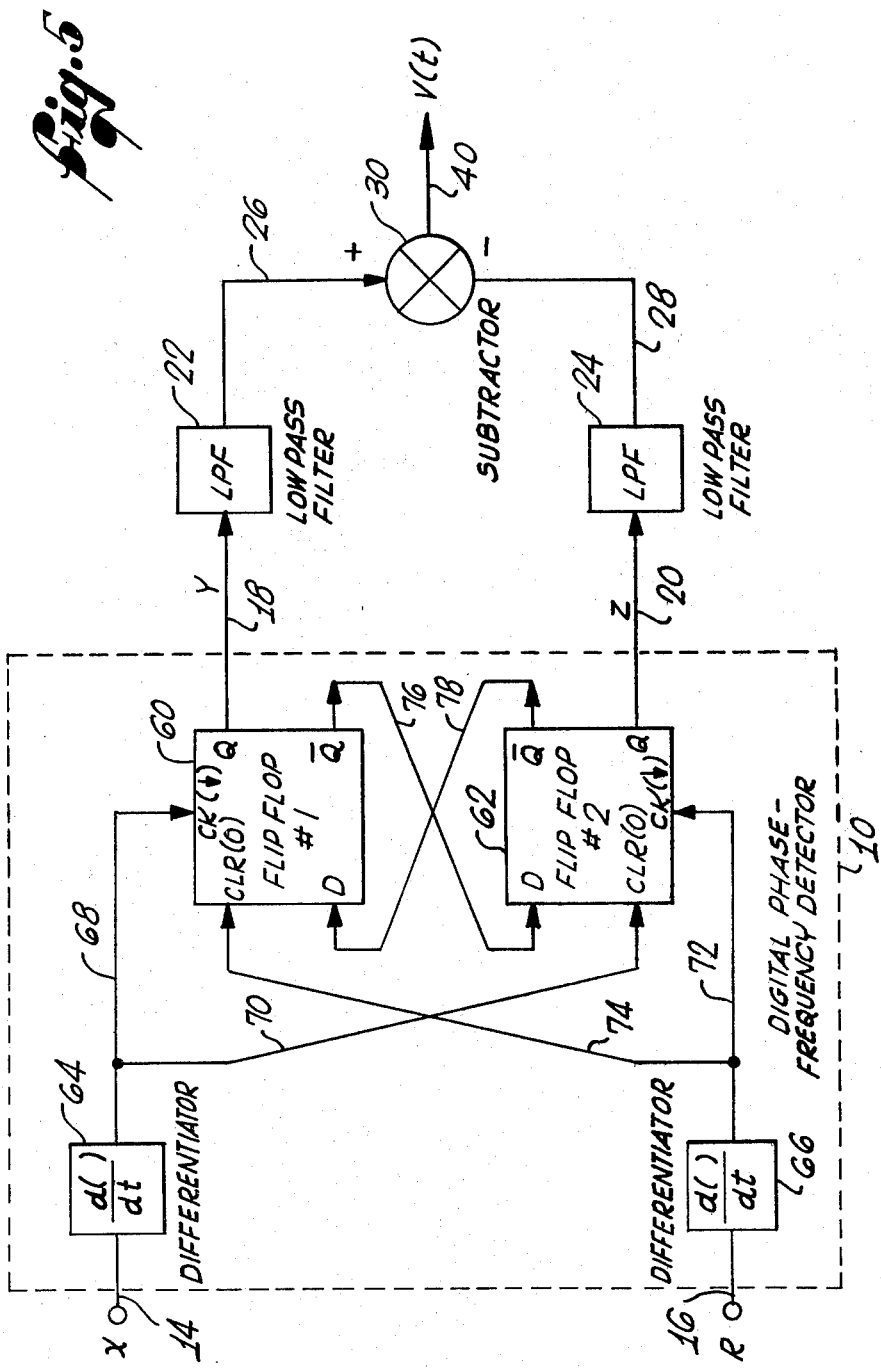
FIG. 5 is a more detailed block diagram of the digital phase-frequency detector utilized in the invention.

As shown in the drawings for purposes of illustration, the present invention is concerned with a system for the acquisition of a carrier signal located at some unknown position in a frequency spectrum, within a range of frequency uncertainty. The frequency uncertainty, for example, can result from inaccuracies in transmitter frequency, or from Doppler shifts caused by relative motion between a transmitter and a receiver. Basically, the function of a signal acquisition system is to translate a relatively wide band of received signals in frequency until the frequency of the desired signal is centered within a very narrow range, referred to as the acquisition window. The signal acquisition system must be able to acquire the desired signal in this manner in a reasonably short time, and in the presence of relatively large noise and interference signal components. Some signal acquisition systems are subject to occasional or frequent failure to center the desired signal within the acquisition window at all, or are subject to false locking, which occurs when the system locks onto a different frequency from the one desired. False locking can sometimes occur if a modulation sideband is incorrectly identified as the desired carrier signal.

In accordance with the invention, signal acquisition is achieved by means of a frequency tracking loop including a digital phase-frequency detector, indicated by reference numeral 10, and a conventional limiter 12. The digital phase-frequency detector 10 has two input lines 14 and 16, and two output lines 18 and 20. The output of the limiter 12 is connected to input line 14, and a locally generated reference frequency signal, indicated by the letter R, is supplied to input line 16. The digital phase-frequency detector produces digital outputs, on lines 18 and 20, indicative of the phase or frequency difference between the signals applied on input lines 14 and 16. These outputs are filtered by low-pass filters 22 and 24, respectively, and then transmitted over lines 26 and 28, respectively, to a subtractor circuit 30.

The remainder of the frequency-tracking loop includes a loop filter 32, a controlled oscillator 34, a mixer 36, and a bandpass filter 38. The output signal from the subtractor 30, on line 40, is indicative of the frequency or phase difference between the two input signals on lines 14 and 16 to the digital phase-frequency detector 10, and is transmitted to the loop filter 32, and thence by line 42 to the controlled oscillator 34. Alternatively, as shown in dashed lines, the acquired output signal may be applied on line 40' or 42' to post demodulation processing circuitry 41, such as an audio amplifier. The output of the controlled oscillator 34 is a single tone, the frequency of which is determined by the value of the input signal applied on line 42. The output of the controlled oscillator 34 is connected by line 44 to one input of the mixer 36, the other input of which, on line 46, receives a relatively wide-band input signal at radio frequencies or intermediate frequencies. The output of the mixer 36 is connected by line 48 to the bandpass filter 38, the output of which is connected by line 50 to the limiter 12.

In general terms, the long frequency-tracking loop shown in FIG. 1 operates in the following manner. A relatively wide band of input signals is supplied to the mixer on line 46, and is mixed or translated to a different, and usually lower frequency band when mixed with the signal supplied by the controlled oscillator 34 over line 44. If the information signal to be acquired has its carrier signal suppressed, carrier signal regeneration circuitry 47 will be required in line 4–6. In any event, the translated band of input signals is bandpass filtered in the filter 38, and applied to the limiter 12, one function of which is to digitize the input signal and provide a practically square-wave input to the digital phase-frequency detector 10, over line 14. The reference-frequency signal is also a square wave, and the operation of the digital phase frequency detector 10 is such that the output signal produced on line 40 has the effect of controlling the oscillator 34 in such a manner that the desired carrier signal is translated to the same frequency as the reference signal on line 16. Before it can be fully appreciated how this result is achieved, however, operation of the digital phase-frequency detector 10 must be understood.

FIG. 5 shows the digital phase-frequency detector 10. The circuitry shown in FIG. 5 is discussed in more detail in a co-pending application Ser. No. 097,087 entitled DIGITAL PHASE-FREQUENCY DETECTOR, of which John E. Crackel is the inventor. Briefly, the digital phase-frequency detector 10 includes two D-type flip-flops 60 and 62 and two differentiator circuits 64 and 66. The differentiators 64 and 66 receive inputs over input lines 14 and 16, respectively, and the Q output terminals of the flip-flops 60 and 62 provide output signals over the output lines 18 and 20, respectively. The output of differentiator 64, which is supplied by input line 14, is connected to the clocking terminal of flip-flop 60, by line 68, and to the reset or clear terminal of flip-flop 62, by line 70. Similarly, the output of differentiator 66 is connected by line 72 to the clocking terminal of flip-flop 62 and by line 74 to the reset or clear terminal of flip-flop 60.

The inverted or $\overline{Q}$ output terminals of flip-flops 60 and 62 are cross-connected to the D input terminals of opposite flip-flops. More specifically, the $\overline{Q}$ output terminal of flip-flop 60 is connected by line 76 to the D input terminal of flip-flop 62, and the $\overline{Q}$ output of flip-flop 62 is connected by line 78 to the D input terminal of flip-flop 60. The flip-flops 60 and 62 are clocked by a falling edge of a clock pulse, and are cleared when a low-level signal is applied to the clear terminals on lines 70 and 74. The differentiators 64 and 66 include appropriate shaping circuitry, so that the outputs from the differentiators are trigger pulses corresponding in time with the falling edges of the input pulses on lines 14 and 16. Thus, at the time of each falling edge of an input signal pulse, a trigger pulse signal is produced and applied to the clocking terminal of one flip-flop and to the clear terminal of the opposite flip-flop. It is important to note that a trigger pulse applied to the clocking terminal of either one of the flip-flops 60 and 62 will set that flip-flop, i.e., provide a logical "one" output at its Q output terminal, only if the other of the flip-flops is already in a clear, or "zero", condition.

It will be appreciated from this brief description that the flip-flops 60 and 62 cannot both be set at the same time, since neither one can be placed in a set condition if the other is already in a set condition. Moreover, the flip-flop to which the lower frequency input signal is applied can never be placed in a set condition, since the other flip-flop will always be in a set condition at the time the trigger signal is applied to the lower frequency flip-flop. Consequently, the trigger signal will temporarily clear the higher-frequency flip-flop but will not set the lower-frequency flip-flop.

The flip-flop to which the higher frequency input signal is applied is termed the "enabled" flip-flop, and the flip-flop to which the lower frequency input signal is applied is termed the "disabled" flip-flop. The flip-flops become enabled or disabled within one period of the frequency difference. Output from the enabled flip-flop is a rectangular pulse train. For unequal frequencies, the widths of the pulses are modulated by the difference frequency. For equal frequencies, the pulses have equal widths with a duty cycle corresponding to the phase difference. When the rectangular pulse train is low-pass filtered, in one of the filters 22 or 24, an analog voltage level representative of the phase or frequency difference is obtained. The two low-pass filtered signals on lines 26 and 28 are subtracted one from the other in the subtractor 40, and the resultant signal, on line 40, is a signed analog signal indicating the magnitude of the phase difference for equal frequencies or the sense of the frequency difference for unequal frequencies. For example, the signal on line 40 may be positive when the input signal on line 14 is the higher frequency signal, and may be negative when the input signal on line 16 is the higher frequency signal.

The ideal frequency characteristic of the digital phase-frequency detector, for frequency ratios which are close to but not unity is shown by the solid line in FIG. 3. $V_L$ is the output voltage level supplied by the flip-flops, and voltage level V(t) is the output voltage on line 40. It will be apparent that, when the frequency of the signal applied to line 14 is greater than that applied to the reference line 16, the ideal output voltage is $\frac{1}{2} V_L$ (within one period of the difference frequency), and when the input frequency falls below the reference frequency, similarly the ideal output voltage is $-\frac{1}{2} V_L$.

The ideal curve shown in FIG. 3 applies only for relatively low values of frequency ratio. For larger ratios the output voltage V(t) approaches $V_L$. By way of contrast, the curves shown as dashed lines and dotted lines in FIG. 3 are typical characteristic curves of a practical circuit operating with noise, whereas the solid line represents an ideal or noise-free case.

When the input frequencies applied to the detector 10 are equal, but the phases are different, the output signal on line 40 assumes the values shown in FIG. 4. It will be noted that the phase characteristic is a two-valued function. For any point on the curve, such as the point A, there exists another point A' that is equally valid. This two-valued nature of the phase characteristic is due to the fact that only one of the two digital phase-frequency detector outputs is active at any time. When the input frequencies are the same, the phase characteristic will assume either positive or negative values exclusively, depending which of the outputs is active. In general, the active or enabled output will be the one that corresponded to the higher frequency input signal most recently within one period of the difference frequency.

As a practical matter, both the phase and frequency detection modes of the digital phase-frequency detector are in effect simultaneously, and it is difficult to construct the characteristic shown in FIG. 4 by merely varying the phase difference at a constant frequency. Variation of the phase difference, after all, amounts to a small variation in frequency. Thus, if one were to start decreasing the phase difference from the point P on the solid part of the characteristic curve, the outputs would become interchanged at the zero crossing point and the dotted curve would be traced thereafter, rather than the solid curve.

Now that the operation of the digital phase-frequency detector has been described, it will be useful to consider how the frequency-tracking loop shown in FIG. 1 functions when a single-frequency signal is supplied on input line 46. Suppose, for example, that the input frequency is 35 megahertz (MHz), and the reference frequency on line 16 is 2.5 MHz. Basically, the operation of the loop will be such that the digital phase-frequency detector 10 will provide a signal to the voltage-controlled oscillator of appropriate magnitude to translate the input signal on line 46 to the frequency of the reference signal on line 16. Thus, in the example given, the controlled oscillator 34 would generate a signal at 37.5 MHz which, when mixed with the 35 MHz input signal, would produce a 2.5 MHz difference signal on line 14.

It will be apparent from the ideal frequency characteristic of FIG. 3 that, when the frequencies applied to the input lines 14 and 16 are different, a substantial positive or negative output signal will be generated on line 40, and applied over line 42 to the oscillator 34. The oscillator 34 is so configured that a too-high frequency on line 14 can be made lower by an appropriate shift of the output frequency from the oscillator, and a too-low frequency on line 14 can be corrected by an opposite shift in the output frequency from the oscillator. In any event, the tendency is for the digital phase-frequency detector 10 to seek a null condition in which its two input frequencies are equal. When frequency equality is attained, the digital phase-frequency detector 10 produces an output signal consistent with the phase characteristic shown in FIG. 4, since, although the frequencies are equal, there may still be a relative phase difference between the signals on lines 14 and 16. The digital phase frequency detector 10 will then lock the two incoming signals 14 and 16 in synchronism, but not necessarily perfectly in phase, and the output of the detector on line 40 will be automatically varied to maintain the frequency of the signal on line 14 equal with the reference frequency on line 16.

When the detector 10 is first activated, the input frequencies on lines 14 and 16 are not, in general, equal, and operation of the detector may be considered to be in two distinct stages, a frequency locking stage and a phase locking stage. In the frequency locking stage, the frequency characteristic shown in FIG. 3 may be considered in effect, and the frequency of output of the controlled oscillator 34 is adjusted automatically by the frequency-tracking loop until the incoming signal on line 46 is translated by the mixer 36 to produce exactly the reference frequency on line 14. Then, in the phase locking stage, the phase characteristic shown in FIG. 4 may be considered in effect, and the two input signals, on lines 14 and 16, become firmly phase-locked, although not necessarily with zero phase difference. As a practical matter, however, it will be understood that the frequency and phase characteristics are really both simultaneously in effect, since the frequency is merely the time derivative of the phase. Consideration of separate frequency and phase characteristics is, however, a useful analysis technique for studying operation of the frequency-tracking loop.

The foregoing description of how the loop operates, when supplied with a single-frequency signal, provides a basis for analyzing how the system operates in a noisy environment. Before the noisy environment is considered, however, it is useful to consider how the loop reacts when supplied with two signals of different frequencies and, in the general case, different amplitudes. It is well known that the sum of two sinusoidal signals of different frequencies provides a composite signal that is equivalent to having one of the signals modulated by the other in both amplitude and phase. However, the limiter 12 limits the amplitudes of all signals applied to it, and therefore inherently suppresses amplitude modulation. Consequently, the signal obtained from the limiter 12 on line 14 is a phase-modulated signal having a spectrum exactly centered at the frequency of the largest amplitude tone. The digital phase-frequency detector 10 will tend to phase lock to the central component of the limiter output spectrum on line 14, although the outputs from the detector will alternate in activity in response to the instantaneous frequency of the phase modulation spectrum. Consequently, strength of the phase lock will be reduced in accordance with the percentage of time spent in toggling of the detector outputs.

A special case involving two injected tones occurs when they are of exactly equal amplitude. The composite signal comprising the two tones can be represented by the following trigonometrical identity:

$$\cos \omega_a t + \cos \omega_b t = 2 \cos [\tfrac{1}{2}(\omega_a - \omega_b)t] \cos [\tfrac{1}{2}(\omega_a + \omega_b)t]$$

This expression will be recognized as representing a carrier at the average frequency of the two tones, the carrier being one hundred percent amplitude modulated at one-half of the difference frequency between the two tones. An ideal limiter would be able to suppress the amplitude modulation completely in this composite signal, and the result would be a square wave signal having the average frequency. However, since the amplitudes are exactly equal, the amplitude of the composite signal will fall to zero periodically, at the difference frequency rate, and this will cause a periodic signal dropout in a practical limiter output for a small percentage of the time. Without any corrections being made to such a system, the dropouts will cause the digital phase-frequency detector to tune to a frequency that is equal to neither of the input frequencies, nor to their average. Although this special case is in a sense academic, since the tones are rarely equal in amplitude, and the frequency loop will usually lock onto one or the other of them, the case of two equal tones provides a basis for understanding how the loop operates in a relatively noisy environment.

FIG. 2 shows a portion of a spectrum of signals, including a carrier signal 80 and a relatively flat balanced spectrum of background noise 82 on line 48 after frequency translation by mixer 36 in FIG. 1. The nominal or expected carrier frequency is indicated by the center line 84, and a range of frequency uncertainty is given by the bandwidth $\pm \Delta F$. The "processing band" is defined as the frequency range $\pm 2\Delta F$ about the nominal or expected carrier frequency. The processing band contains the only part of the input spectrum that can pass through the frequency tracking loop if the loop is tuned so that the center of the bandwidth admitted to the phase-frequency detector is moved across the frequency uncertainty window from one extreme to the other.

A "loop carrier band" is the double-sided equivalent of the loop low-pass bandwidth when the latter is referred to either the loop input or to the bandpass filter. Thus, the loop carrier band is twice the width of the low-pass response of the loop, as conventionally determined by the loop filter 32. The function of the loop bandwidth is to determine a compromise between acquisition time and the frequency jitter of the controlled oscillator 34 due to input noise, on nulling of the phase-frequency detector. It would be possible to make the loop bandwith relatively wide, even wider than the uncertainty frequency range, and still have the digital phase frequency detector operate to center the input spectrum. However, this would be a relatively gross signal acquisition in a noise background, since the instantaneous frequency of the controlled oscillator 34 would be out of the intended acquisition window much of the time. In contrast, a relatively narrow loop carrier band will minimize jitter, but may result in slower acquisition times.

Initially, all that is known about the desired carrier 80 is that it is located somewhere within the frequency uncertainty window. Operation of the frequency-tracking loop thereafter can be thought of as movement of an input window equal in width to the uncertainty window, over a range from one end of the processing band to the other. FIG. 2 shows the input window moving to the left after being initially centered within the loop carrier band. An instant is shown in FIG. 2, when the desired carrier lies just outside the loop carrier band.

If no carrier signal were present in the input spectrum, and if the background noise 82 were substantially flat and balanced, the digital phase-frequency detector would produce outputs summing to practically zero for any tuning of the controlled oscillator 34. This is because any input band to which the phase frequency detector was tuned would have an average frequency at the center of the band, and the detector would therefore not lock onto any particular frequency. If the background noise becomes effectively unbalanced, however, the detector and limiter will be "captured" by the largest-amplitude component of the background, or the loop may null to an input frequency that represents the composite average of the input spectrum. Such an average value may not necessarily correspond to the desired carrier frequency, of course. These possibilities are all acquisition failures, and are highly undesirable.

One way to overcome the lack of uniformity or unbalance in the noise background is to increase the power of the carrier signal such that the limiter and detector will necessarily capture the carrier. A more interesting alternative, however, is to offset the effects of noise unbalance in the background by means of a programmed dc bias signal. The carrier can then be acquired even when the carrier-to-noise ratio is relatively low. One technique for determining the amount of dc bias to be used is to first remove the desired carrier signal from the background, and then to analyze the effect of noise on the output signal on line 40 from the subtractor 30, by deliberately tuning the loop from one end of the processing range to the other. At a multiplicity of points in this spectrum, the voltage on line 40 can be recorded, and corresponding values of dc bias voltage can be later generated for each of the selected points in the spectrum. The point-by-point voltages recorded will be indicative of the noise unbalance at the selected points in the spectrum, and the injected dc bias signals will have the effect of forcing the loop to operate as though there were no unbalance and the noise were perfectly flat. Of course, this process would have to be repeated if the noise environment were to change significantly, but it nevertheless provides a useful technique for compensating for irregularities in the noise spectrum, and thereby obtaining improved performance of the frequency tracking loop.

Figure 9:
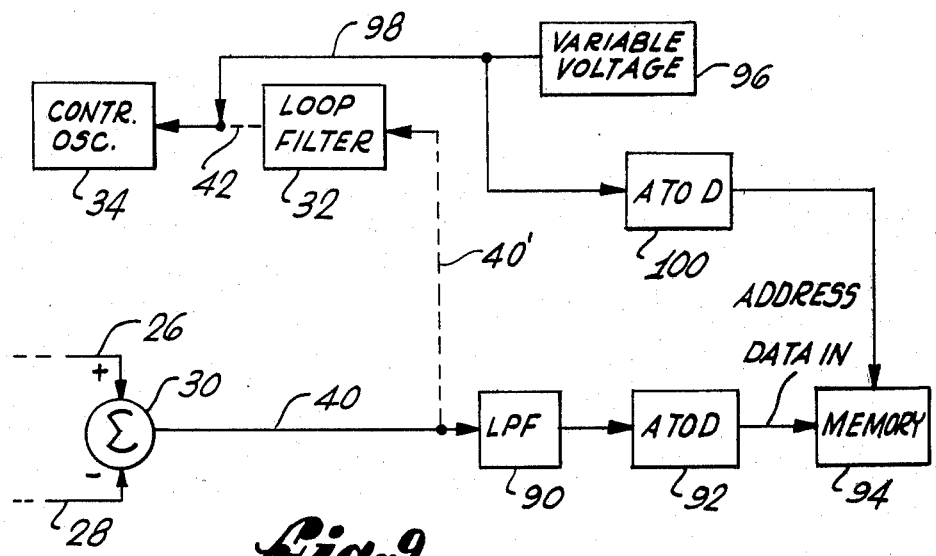
FIG. 9 is a fragmentary block diagram showing how the system of the invention may be calibrated to derive noise unbalance compensation signals.
Figure 10:
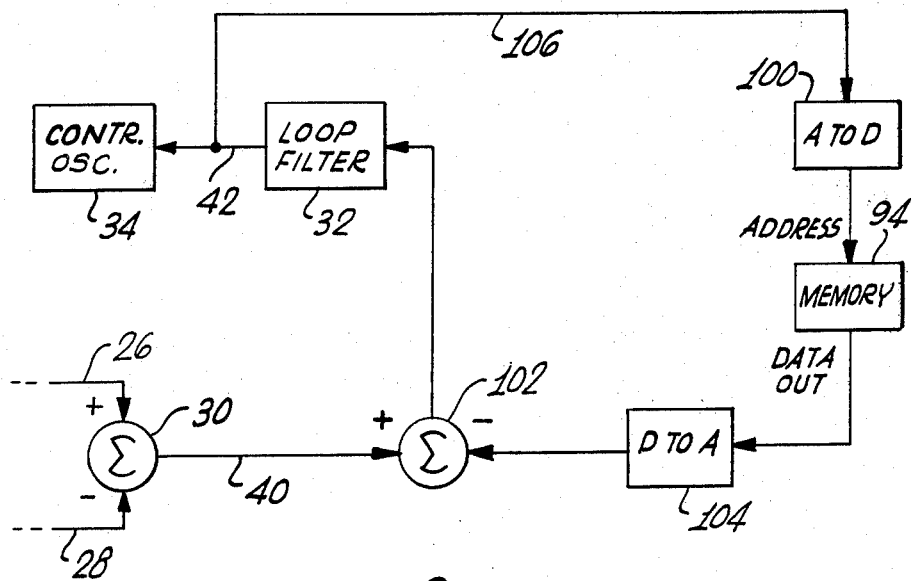
FIG. 10 is a fragmentary block diagram showing how the system of the invention may be operated to compensate for noise unbalance.

A more specific configuration for noise unbalance compensation is shown in FIGS. 9 and 10. As shown in FIG. 9, the output line 40 from the subtractor 30 is broken, as indicated at 40', for purposes of calibration of the loop to compensate for noise unbalance. The output line 40 is connected temporarily through a low-pass filter 90 to an analog-to-digital converter 92, the output of which provides data inputs to a digital memory unit 94. The memory unit has a capacity for storing a number of digital quantities in addressable storage locations.

During calibration, the controlled oscillator 34 is no longer supplied with control signals from the loop filter 32, but instead is controlled by signals from a variable voltage source 96, supplied over line 98. The variable voltage signals are also converted to digital form in a second analog-to-digital converter 100, and employed to select the memory address of the memory unit 94. Thus, the memory address selected depends upon the level of the variable voltage signals, which is, in turn, directly related to the output frequency of the controlled oscillator 34.

When the variable voltage source 96 is swept across a range corresponding to the sweep of the oscillator 34 in moving across the frequency uncertainty band, the analog signals on line 40 from the subtractor will be indicative of the noise unbalance across the band. These signals will be stored in the memory 94 to be retrieved when the loop is later closed for normal operation.

As shown in FIG. 10, noise unbalance compensation is effected by means of a second subtractor circuit 102 connected to receive a positive input from the first subtractor 30 and a negative input from a digital-to-analog converter 104, which receives input signals from the memory 94. The address for retrieval of data from the memory 94 is derived from the oscillator control signal on line 42, which is connected by line 106 to analog-to-digital converter 100, and thence to the address selection lines to the memory.

In operation, dc bias signals, stored in digital form during the calibration phase, are retrieved and added negatively to the output of the subtractor 30. Thus the frequency-tracking loop behaves as if a substantially flat noise spectrum were present. When the carrier signal is restored, it can be acquired from a more noisy environment than would be possible if the noise unbalance had not been compensated.

The desired carrier signal in an ideal situation represents the only unbalance over the background spectrum. With this in mind, an important constraint on carrier power can be stated. The carrier power, which is defined to include all the power in a band equal to the loop carrier band, and centered at the carrier frequency, must exceed the background power unbalance in any other equal band across the band of frequency uncertainty. Moreover, the carrier must exceed the power due to the background imbalance in any other loop carrier band by at least the amount of the limiter threshold level. If the loop carrier band were to be made relatively wide, the noise unbalance in a particular loop carrier band might exceed the carrier power. In most applications, however, the loop carrier bandwidth can be made small enough to satisfy the power constraint.

The frequency tracking loop of the invention has been found to consistently acquire a carrier frequency in conditions providing carrier-to-noise ratios of −10 dB to −20 dB. In this regard, the carrier-to-noise ratio is representative of the ratio of carrier power, as previously defined, to noise power over the full bandwidth received by the digital phase-frequency detector, as indicated at 108 in FIG. 2.

A number of further improvements in the acquisition loop are shown in FIGS. 6—8. In the first such improvement, the bandpass filter 38 is replaced by a plurality of bandpass filters, indicated generally at 38', and fed from a signal splitter 110, which receives the translated signals on line 48 from the mixer 36. Each of the plurality of filters 38' provides an output to a separate pole of a multi-position switch 12, which allows any one of the plurality of filters to be selected for connection to line 50. This arrangement takes advantage of the fact that, as the loop nulls or pulls in, the bandwidth of the bandpass filter can be reduced, thereby increasing the carrier-to-noise ratio and accelerating the acquisition of the carrier signal. The switch 112 can be controlled either on the basis of frequency monitoring, or by a time delay sequence that assumes a maximum frequency deviation initially. Application of the input signal simultaneously to all of the filters 38 minimizes the effects of filter time delay that might be felt if a switch had been used rather than a signal splitter.

Another improvement, shown in FIG. 7, provides for a loop filter 32' the passband of which may be made wide initially, to speed up the acquisition process, then reduced to a smaller value required to minimize loop jitter when the acquisition window is reached.

In accordance with another aspect of the invention, in some applications when acquisition of the desired carrier signal is detected, the acquired carrier signal is "handed over" to post-acquisition control circuitry 115. The handover circuitry, the location of which is indicated at 113 in FIG. 1, is schematically represented as a double-pole-double-throw switch 114 connected in lines 42 and 48, respectively. When the switches are in a first position, as shown in FIG. 6, the loop is intact and operates as previously described, but when the switches are thrown to the second position, the output of the mixer 36 on line 48 is connected to line 96 to some form of post-acquisition control circuitry 115, such as a Costas loop when the carrier signal is bi-phase modulated. At the same time the controlling input line 42 to the controlled oscillator 34 is connected over line 98, also to the post-acquisition control circuitry 115, so that the oscillator may be controlled appropriately to maintain phase lock between the incoming and reference signals. In accordance with this aspect of the invention, the handover circuitry, i.e., the switch 114, is controlled by an amplitude detector 116 and a zero detector 118 or comparator. The amplitude detector 116 measures the amplitude of a beat frequency signal that is known to occur in the control loop, in the line 42 to the controlled oscillator 34, just before the loop pulls completely in. The amplitude detector 116 is ac coupled to the control line 42 so, as the loop pulls in, the detected amplitude of the beat signal will fall. When the magnitude of the detected signal falls to a sufficiently small level, the zero detector 118, which is basically a comparator circuit, generates a control signal to activate the switch 114, and switch control to the post-acquisition control circuitry 115.

As will be appreciated from the foregoing, the present invention represents a significant advance in the field of signal acquisition systems. In particular, it provides a technique for acquiring a carrier signal from a relatively noisy environment in relatively short acquisition times. It will also be appreciated that, although a specific embodiment of the invention has been described in detail for purposes of illustration, various modifications, may be made without departing from the spirit and scope of the invention. Accordingly, the invention is not to be limited except as by the appended claims.

We claim:

1. A signal acquisition system for tuning to a desired communication signal, the exact frequency of which is unknown, in a noisy environment, said system comprising:

signal input means, for receiving a wide band of input signals, including possible signal and noise components at various frequencies in the band;

mixing means, for translating in a frequency all of the components of the band of input signals through a controllable frequency difference, to produce a translated band of input signals;

controlled oscillator means, for supplying a frequency-controlled signal to said mixing means to translate the band of input signals;

bandpass filter means to obtain a selected bandwidth of frequencies from the translated band of input signals, the selected bandwidth being very wide compared with the bandwidth of the desired communication signal;

limiter means, to limit the amplitude of the controlled signal to said mixer, to control the amount through which the band of input signals is translated;

a bandpass filter, to obtain a selected bandwidth of frequencies from the translated band of input signals for further processing, the selected bandwidth being very wide compared with the bandwidth of the desired carrier signal;

a limiter, for limiting the amplitude of the translated and selected band of input signals to a relatively small value;

a digital phase-frequency detector having one input supplied by the limited input signals, and another provided by a reference frequency signal, and providing two output signals, of which only one is active at any time, to indicate the higher frequency input signal or the phase difference when the frequencies are equal;

means for combining the output signals of said digital phase-frequency detector to yield a signed analog control signal indicative of the frequency of phase difference between the reference frequency signal and any dominant frequency component of the limited input signals, the control signal being applied to control the frequency of said controlled oscillator, to translate in frequency a selected bandwidth of frequencies automatically toward the desired carrier signal; and a low-pass loop filter to filter out rapidly varying components of the analog control signal;

wherein said digital phase-frequency detector is practically insensitive to a flat and balanced noise spectrum and will lock onto the desired carrier signal provided the carrier signal power exceeds the outof-balance noise power over a selected frequency band.

2. A signal acquisition system as set forth in claim 1, and further including:
   low-pass loop filter means for filtering the control signal from said digital phase and frequency detection means, to minimize jitter in the control of said controlled oscillator.

3. A signal acquisition system as set forth in claim 2, wherein said low-pass loop filter means is dynamically variable to provide a relatively wide passband at the start of acquisition and a relatively narrow passband as acquisition is completed.

4. A signal acquisition system as set forth in claim 1, and further including:
   means for detecting when the communication signal has been acquired; and
   means for switching control of said controlled oscillator to post-acquisition control circuitry.

5. A signal acquisition system as set forth in claim 1, wherein:
   the control signal fed back to said controlled oscillator means is indicative of changes in the frequency of the received input signals, and the signal acquisition system therefore operates as a frequency demodulator; and
   said system further includes post-demodulation processing means, for further processing the control signal that is also fed back to said controlled oscillator means.

6. A signal acquisition system, for tuning to a desired carrier signal, the exact frequency of which is unknown, the carrier signal being subject to noise and interference signal components, the total power of which may greatly exceed that of the carrier signal, said system comprising:
   signal input means, for receiving a wide band of input signals, including possible signal and noise components at various frequencies in the band;
   a mixer for translating in frequency all of the components of the band of input signals through a controllable frequency difference, to produce a translated band of input signals;
   a controlled oscillator, for supplying a frequency-translated and selected band of input signals to a relatively low threshold level; and
   digital phase and frequency detection means, to produce a control signal indicative of frequency and phase differences between the limited input signals and a locally generated reference signal, the control signal being fed back to said controlled oscillator means to translate in frequency a selected bandwidth of frequencies automatically toward the desired communication signal;
   whereby the control signal produced by said digital phase and frequency detection means controls said controlled oscillator means in such a manner that the input signals are translated in frequency until the limited input signal is equal in frequency to the reference signal.

7. A signal acquisition system as set forth in claim 6, wherein said low-pass loop filter means is dynamically variable to provide a relatively wide passband at the start of acquisition and a relatively narrow passband as acquisition is completed.

8. A signal acquisition system as set forth in claim 6, and further including:
   means for detecting when the communication signal has been acquired; and
   means for switching control of said controlled oscillator to post-acquisition control circuitry.

9. A signal acquisition system as set forth in claim 6, wherein:
   the control signal fed back to said controlled oscillator is indicative of changes in the frequency of the received input signals, and the signal acquisition system therefore operates as a frequency demodulator; and
   said system further includes post-demodulation processing means, for further processing the control signal that is also fed back to said controlled oscillator.

10. A signal acquisition system for tuning to a desired communication signal, the exact frequency of which is unknown, in a noisy environment, said system comprising:
    signal input means, for receiving a wide band of input signals, including possible signal and noise components at various frequencies in the band;
    mixing means for translating in frequency all of the components of the band of input signals through a controllable frequency difference, to produce a translated band of input signals;
    controlled oscillator means, for suppling a frequency-controlled signal to said mixing means to translate the band of input signals;
    limiter means, to limit the amplitude of the translated band of input signals to a relatively low threshold level;
    digital phase and frequency detection means, to produce a control signal indicative of frequency and phase differences between the limited input signals and a locally generated reference signal, the control signal being fed back to said controlled oscillator means; and
    bandpass filter means to select a desired bandwidth of frequencies from the translated band of input signals for processing by said limiter means and said digital phase and frequency detection means, said bandpass filter means being dynamically variable to provide a relatively wide passband at the start of acquisition and a narrower passband as acquisition is completed, to increase the power ratio between the desired signal and noise within the passband, thereby accelerating acquisition;
    whereby the control signal produced by said digital phase and frequency detection means controls said controlled oscillator means in such a manner that the wide band of input signals is translated in frequency until signals derived from said limiter means are equal in frequency to the reference signal.

11. A signal acquisition system for tuning to a desired communication signal, the exact frequency of which is unknown, in a noisy environment, said system comprising:
    signal input means, for receiving a wide band of input signals, including possible components at various frequencies in the band;
    mixing means, for translating in frequency all of the components of the band of input signals through a controllable frequency difference, to produce a translated band of input signals;

controlled oscillator means, for supplying a frequency-controlled signal to said mixing means to translate the band of input signals;

limiter means, to limit the amplitude of the translated band of input signals to a relatively low threshold level;

digital phase and frequency detection means, to produce a control signal indicative of frequency and phase differences between the limited input signals and a locally generated reference signal, the control signal being fed back to said controlled oscillator means;

low-pass loop filter means for filtering the control signal from said digital phase and frequency detection means, to minimize jitter in the control of said controlled oscillator;

bandpass filter means to select a desired bandwidth of frequencies from the translated input signals for processing by said limiter means and said digital phase and frequency detection means, said bandpass filter means being dynamically variable to provide a relatively wide passband at the start of acquisition and a narrower passband as acquisition is completed, to increase the power ratio between the desired signal and noise within the passband, and thereby accelerate acquisition;

whereby the control signal produced by said digital phase and frequency detection means controls said controlled oscillator means in such a manner that the wide band of input signals is translated in frequency until signals derived from said limiter means are equal in frequency to the reference signal.

12. A signal acquisition system for tuning to a desired communication signal, the exact frequency of which is unknown, in a noisy environment, said system comprising:

signal input means, for receiving a wide band of input signals, including possible signal and noise components at various frequencies in the band;

mixing means, for translating in frequency all of the components of the band of input signals through a controllable frequency difference, to produce a translated band of input signals;

controlled oscillator means, for supplying a frequency-controlled signal to said mixing means to translate the band of input signals;

limiter means, to limit the amplitude of the translated band of input signals to a relatively low threshold level; and digital phase and frequency detection means, to produce a control signal indicative of frequency and phase differences between the limited input signals and a locally generated reference signal, the control signal being fed back to said controlled oscillator means;

whereby the control signal produced by said digital phase and frequency detection means controls said controlled oscillator means in such a manner that the wide band of input signals is translated in frequency until signals derived from said limiter means are equal in frequency to the reference signal;

and wherein said digital phase and frequency detection means includes differentiation means coupled to input lines carrying the limited input signals and the reference frequency signals, to provide a trigger pulse on the occurrence of a selected pulse edge of the input and reference frequency signals;

two memory means, each coupled to an input line in such a manner as to be set by a trigger pulse only when the other memory means is not set, and to be cleared by a trigger pulse on the input line to the other memory means;

two low-pass filters connected to output lines from said corresponding memory means; and a subtractor circuit for subtracting one low-pass filter output from the other, to produce the control signal indicative of phase and frequency differences between the input signals and the reference frequency signal.

13. A signal acquisition system as set forth in claim 12, wherein:

said memory means are D-type flip-flops, each having an inverted output terminal cross-connected to the D input terminal of the other flip-flop, and each having an input line from one of said differentiation means connected to a clocking terminal and cross-connected to a clearing terminal of the other flip-flop.

14. A signal acquisition system, for tuning to a desired carrier signal, the exact frequency of which is unknown, the carrier signal being subject to noise and interference signal components, the total power of which may greatly exceed that of the carrier signal, said system comprising:

signal input means, for receiving a wide band of input signals, including possible signal and noise components at various frequencies in the band;

a mixer, for translating in frequency all of the components of the band of input signals through a controllable frequency difference, to produce a translated band of input signals;

a controlled oscillator, for supplying a frequency-controlled signal to said mixer, to control the amount through which the band of input signals is translated;

a bandpass filter, to select a desired bandwidth of frequencies from the translated input signals for further processing;

a limiter, for limiting the amplitude of the translated and selected signals to a relatively small value;

a digital phase-frequency detector having one input supplied by the limited input signals, and another provided by a reference frequency signal, and providing two output signals, of which only one is active at any time, to indicate the higher frequency input signal or the phase difference when the frequencies are equal;

means for combining the output signals of said digital phase-frequency detector to yield a signed analog control signal indicative of the frequency or phase difference between the reference frequency signal and any dominant frequency component of the limited input signals, the control signal being applied to control the frequency of said controlled oscillator;

a low-pass loop filter to filter out rapidly varying components of the analog control signal; and compensation means connected between said means for combining output signals and said controlled oscillator, for compensating for the effect of an unbalanced noise spectrum, to allow for acquisition in conditions of relatively low carrier-to-noise power ratio;

wherein said digital phase-frequency detector is practically insensitive to a flat and balanced noise spectrum and will lock onto the desired carrier signal provided the carrier signal power exceeds the out-of-balance noise power over a selected frequency band.

15. A signal acquisition system as set forth in claim 14, wherein said means for compensating for the effect of an unbalanced noise spectrum includes:
  means for recording the output signals from said digital phase-frequency detector due to an unbalanced noise spectrum and in the absence of a carrier signal; and
  means for injecting compensating signals into the analog control signal fed back to said controlled oscillator, said compensating signals being derived from the output signals recorded by said means for recording, whereby the analog control signal is compensated for the effect of an unbalanced noise spectrum.

16. A signal acquisition system as set forth in claim 15, wherein:
  said means for recording output signals includes addressable storage means, means for generating storage addresses derived from the level of the control input signal applied to said controlled oscillator, and therefore based on the frequency output from said controlled oscillator, and means for varying the control input signal to and the frequency output from said controlled oscillator to obtain a plurality of stored output signals corresponding to a plurality of frequency settings of said controlled oscillator; and
  said means for injecting compensating signals includes means for retrieving a selected one of the stored output signals and means for subtracting it from the analog control signal fed back to said controlled oscillator.

17. A signal acquisition system for tuning to a desired carrier signal, the exact frequency of which is unknown, the carrier signal being subject to noise and interference signal components, the total power of which may greatly exceed that of the carrier signal, said system comprising:
  signal input means, for receiving a wide band of input signals including possible signal and noise components at various frequencies in the band;
  a mixer, for translating in frequency all of the components of the band of input signals through a controllable frequency difference, to produce a translated band of input signals;
  a controlled oscillator, for supplying a frequency-controlled signal to said mixer, to control the amount through which the band of input signals is translated;
  a bandpass filter, to select a desired bandwidth of frequencies from the translated band of input signals for further processing;
  a limiter, for limiting the amplitude of the translated and selected band of input signals to a relatively small value;
  a digital phase-frequency detector having one input supplied by the limited input signals, and another provided by a reference frequency signal, and providing two output signals, of which only one is active at any time, to indicate the higher frequency input signal or the phase difference when the frequencies are equal;
  means for combining the output signals of said digital phase-frequency detector to yield a signed analog control signal indicative of the frequency or phase difference between the reference frequency signal and any dominant frequency component of the limited input signals, the control signal being applied to control the frequency of said controlled oscillator; and
  a low-pass loop filter to filter out rapidly varying components of the analog control signal;
  wherein said digital phase-frequency detector is practically insensitive to a flat and balanced noise spectrum and will lock onto the desired carrier signal provided the carrier signal power exceeds the out-of-balance noise power over a selected frequency band;
  and wherein said bandpass filter means is dynamically variable to provide a relatively wide passband at the start of acquisition and a narrower passband as acquisition is completed, to increase the power ratio between the desired signal and noise within the passband, thereby accelerating acquisition.

18. A signal acquisition system as set forth in claim 17, wherein said low-pass loop filter means is dynamically variable to provide a relatively wide passband at the start of acquisition and a relatively narrow passband as acquisition is completed.

19. A signal acquisition system, for tuning to a desired carrier signal, the exact frequency of which is unknown, the carrier signal being subject to noise and interference signal components, the total power of which may greatly exceed that of the carrier signal, said system comprising:
  signal input means, for receiving a wide band of input signals, including possible signal and noise components at various frequencies in the band;
  a mixer, for translating in frequency all of the components of the band of input signals through a controllable frequency difference, to produce a translated band of input signals;
  a controlled oscillator, for supplying a frequency-controlled signal to said mixer, to control the amount through which the band of input signals is translated;
  a bandpass filter, to select a desired bandwidth of frequencies from the translated input signals for further processing;
  a limiter, for limiting the amplitude of the translated and selected band of input signals to a relatively small value;
  a digital phase-frequency detector having one input supplied by the limited input signals, and another provided by a reference frequency signal, and providing two output signals, of which only one is active at any time, to indicate the higher frequency input signal or the phase difference when the frequencies are equal;
  means for combining the output signals of said digital phase-frequency detector to yield a signed analog control signal indicative of the frequency or phase difference between the reference frequency signal and any dominant frequency component of the limited input signals, the control signal being applied to control the frequency of said controlled oscillator; and
  a low-pass loop filter to filter out rapidly varying components of the analog control signal;

wherein said digital phase-frequency detector is practically insensitive to a flat and balanced noise spectrum and will lock onto the desired carrier signal provided the carrier signal power exceeds the out-of-balance noise power over a selected frequency band;

and wherein said digital phase and frequency detection means includes:

differentiation means coupled to input lines carrying the limited input signals and the reference frequency signals, to provide a trigger pulse on the detection of a selected pulse edge of the input and reference frequency signals;

two memory means, each coupled to an input line in such a manner as to be set by a trigger pulse only when the other memory means is not set, and to be cleared by a trigger pulse on the input line to the other memory means; and two low-pass filters connected to output lines from said corresponding memory means.

20. A signal acquisition system as set forth in claim 19, wherein:

said memory means are D-type flip-flops having their inverted output terminals cross-connected to their D input terminals, and having input lines from said differentiation means connected to clocking terminals and cross-connected to clearing terminals.

21. A method for acquiring a carrier signal received in wide a band of input signals having noise and interference components, the exact frequency of the carrier signal being unknown, said method comprising the steps of:

translating the band of input signals in frequency, by a frequency difference determined by the output frequency of a controlled oscillator, to produce a translated band of input signals;

bandpass filtering the translated band of input signals;

limiting the translated and bandpass filtered band of input signals to a relatively low amplitude to provide a corresponding train of input pulses;

generating control signals indicative of the frequency or phase difference between the input pulses and a reference frequency signal;

applying the control signals to the controlled oscillator to control the frequency translation of the wide band of input signals in such a manner that the input signals are translated in frequency until the input pulses derived from said limiting step have a frequency equal to the reference frequency;

maintaining the translated carrier signal in a constant phase relationship with the reference frequency signal; and compensating the generated control signals for unbalance in the interference and noise components, to allow for acquisition in conditions of relatively low carrier-to-noise power ratio.

22. A method for acquiring a carrier signal as set forth in claim 21, wherein said compensating step includes:

deactivating the carrier signal, so that only noise and interference components are included in the input signals;

disconnecting the generated control signals from the controlled oscillator;

applying an adjustable signal to the controlled oscillator;

recording the control signals generated by said generating step;

then reapplying the generated control signals to the controlled oscillator;

injecting compensation signals, derived from the recorded control signals, into the control signals applied to the controlled oscillator, to simulate a perfectly balanced noise spectrum; and reactivating the carrier signal.

* * * * *